United States Patent

Howald et al.

[11] Patent Number: 6,074,516
[45] Date of Patent: Jun. 13, 2000

[54] HIGH SPUTTER, ETCH RESISTANT WINDOW FOR PLASMA PROCESSING CHAMBERS

[75] Inventors: Arthur M. Howald, Pleasanton; Anthony L. Chen, Oakland; Alan M. Schoepp, Ben Lomond, all of Calif.

[73] Assignee: Lam Research Corporation, Fremont, Calif.

[21] Appl. No.: 09/103,357

[22] Filed: Jun. 23, 1998

[51] Int. Cl.[7] .................................................. C23C 16/00
[52] U.S. Cl. ......................... 156/345; 118/715; 118/723 I
[58] Field of Search .......................... 156/345; 118/723 I, 118/118 E, 723 R, 715

[56] References Cited

U.S. PATENT DOCUMENTS

| | | | |
|---|---|---|---|
| 4,618,262 | 10/1986 | Maydan et al. | 356/357 |
| 4,927,485 | 5/1990 | Cheng et al. | 156/345 |
| 5,023,188 | 6/1991 | Tanaka | 437/8 |
| 5,151,584 | 9/1992 | Ebbing et al. | 250/201.4 |
| 5,226,967 | 7/1993 | Chen et al. | 118/723 |
| 5,337,144 | 8/1994 | Strul et al. | 356/357 |
| 5,355,217 | 10/1994 | Canteloup et al. | 356/357 |
| 5,450,205 | 9/1995 | Sawin et al. | 356/382 |
| 5,614,055 | 3/1997 | Fairbairn et al. | 156/345 |
| 5,647,944 | 7/1997 | Tsubaki et al. | 156/345 |
| 5,648,849 | 7/1997 | Canteloup et al. | 356/357 |
| 5,779,848 | 7/1998 | Aruga | 156/345 |
| 5,846,883 | 12/1998 | Moslehi | 156/643.1 |

FOREIGN PATENT DOCUMENTS

| | | | |
|---|---|---|---|
| 01319687 | 12/1989 | European Pat. Off. | C23F 1/04 |
| 07066184 | 3/1995 | European Pat. Off. | H01L 21/3065 |
| 09115455 | 5/1997 | European Pat. Off. | H01J 27/16 |

OTHER PUBLICATIONS

International Search Report, EPO, (Oct. 27, 1999).

*Primary Examiner*—Richard Bueker
*Assistant Examiner*—Erin Fieler
*Attorney, Agent, or Firm*—Beyer Weaver Thomas & Nguyen, LLP

[57] ABSTRACT

A window of a plasma processing chamber. The window includes a first dielectric portion having a first electrical thickness and a first resistivity to an etching plasma that is formed within the plasma processing chamber. There is further included a second dielectric portion disposed within the first dielectric portion. The second dielectric portion has a second electrical thickness that is less than the first electrical thickness. The second dielectric portion is formed of a substantially transparent material and has a second resistivity to the etching plasma. The second resistivity is higher than the first resistivity.

18 Claims, 3 Drawing Sheets

HIGH SPUTTER, ETCH RESISTANT WINDOW FOR PLASMA PROCESSING CHAMBERS

BACKGROUND OF THE INVENTION

The present invention relates to the fabrication of semiconductor-based devices. More particularly, the present invention relates to improved techniques for maintaining the transparency of observation windows employed in plasma-enhanced semiconductor processing systems.

In the fabrication of semiconductor-based devices, e.g., integrated circuits or flat panel displays, layers of materials may alternately be deposited onto and etched from a substrate surface. As is well known in the art, the etching of the deposited layers may be accomplished by a variety of techniques, including plasma-enhanced etching. In plasma-enhanced etching, the actual etching of the substrate (e.g., the semiconductor wafer or the glass panel) typically takes place inside a plasma processing chamber. To form the desired pattern on the substrate's layer(s), an appropriate mask, which may be either a photoresist or a hard mask, is typically provided. A plasma is then formed from a suitable etchant source gas to etch areas of the substrate that are unprotected by the mask, leaving behind the desired pattern.

Among different types of plasma processing systems, inductively coupled plasma processing systems have proven to be highly suitable for forming the ever shrinking features on the substrate. In general, an inductively coupled plasma processing system employs a powered electrode to maintain the etching plasma by inductively coupling with it through a dielectric window.

To facilitate discussion, FIG. 1 depicts a simplified sketch of an exemplary plasma processing system typical of the type employed to etch substrates during the manufacture of semiconductor-based devices. In FIG. 1, the plasma processing system depicted happens to be a low pressure, high density inductively-coupled plasma processing system. As will be apparent to those skilled in the art, however, the invention is not so limited.

Referring now to FIG. 1, a plasma processing system 100 includes a plasma processing chamber 102. Above chamber 102, there is disposed an electrode 104 which is implemented by a coil in the example of FIG. 1, although other mechanisms for inductively coupling the RF energy to the plasma within the plasma processing chamber may also be employed. Electrode 104 is energized by a radio frequency (RF) generator 106 via a matching network (conventional and omitted to simplify the illustration). In the example of FIG. 1, RF generator 106 supplies RF energy having a frequency of about 13.56 MHz although other appropriate frequencies may also be employed.

Within plasma processing chamber 102, there is shown a dielectric window 110, representing the dielectric window through which the plasma inside the chamber is inductively coupled with electrode 104. In the typical case, dielectric window 110 is formed of a suitable dielectric material, such as fused silica or alumina, that permits the aforementioned inductive coupling action to take place. Etchant source gases may be introduced into the chamber interior by an appropriate gas distribution apparatus (not shown to simplify the illustration) such as a shower head, or a gas distribution ring, or simply ports disposed near dielectric window 110 or in the chamber walls as is shown. Through the inductive coupling action, an etching plasma is formed in the RF-induced plasma region 112 between dielectric window 110 and a substrate 114.

Substrate 114 having thereon the layer(s) to be etched is introduced into plasma processing chamber 102 and disposed on a chuck 116, which acts as a second electrode and is preferably biased by a radio frequency generator 118 through a matching network (conventional and omitted to simplify the illustration). For the purpose of the present invention, chuck 116 may represent any type of workpiece holder arrangement, such as an electrostatic chuck, or a mechanical clamping-type chuck, and may assume any configuration, including a cantilever configuration. Like RF generator 106, RF generator 118 in the example of FIG. 1 may source RF energy having any suitable frequency (e.g., between 2–13 MHz in some systems). There is provided an exhaust port 120, which may be coupled to an appropriate turbo pump arrangement to facilitate the removal of the etch byproducts and to maintain the desired low pressure within chamber 102 during etching.

To avoid etching too deeply into substrate 114, which may unintentionally damage the underlying regions, it is important to terminate the etch at the appropriate time. There exist in the art many techniques for ascertaining when etching should terminate, some of which require monitoring the progress of the etch in order to ascertain the end point. In certain low density plasma etch reactors, for example, interferometric techniques have been employed to ascertain the depth of the etch at a given point in time to ascertain whether etching should be permitted to continue. An example of an interferometry-based etch depth monitoring technique may be found in U.S. Pat. No. 5,450,205.

In general, interferometric techniques of etch depth monitoring involve illuminating the area being etched with an illumination source, which may be a laser light source, a tungsten/halogen lamp, plasma emission, or the like, and monitoring the reflected beam for the characteristic periodic optical interference pattern of repetitive maxima and minima. Using an appropriate logic circuit, information pertaining to the current depth of the etch may be ascertained from the pattern of repetitive maxima and minima in the reflected beams. Such information may then be employed, for example, to end point the etch. Interferometric techniques of etch depth monitoring are well known in the art and will not be discussed in detail for brevity's sake.

In a typical plasma processing chamber, both the light source and the optoelectronic device employed to monitor the reflected beams are typically disposed outside of the chamber to avoid exposing these components to the corrosive etching environment within the plasma processing chamber. Because of this, the plasma processing chamber needs to have a relatively transparent observation window through which the illuminating beams and the reflected beams may pass. An exemplary arrangement is depicted in FIG. 2 wherein both an illuminating beam 202 from a light source 204 and a reflected beam 206 pass through transparent observation window 212. For completeness, collimating and focusing optics arrangement 208 as well as detector 210 are also shown.

It has been observed, however, that the performance of the interferometry-based monitoring technique tends to degrade significantly when the transparency of the observation window degrades. The loss of transparency may occur when the interior surface of the observation window is roughened due to the deposition of etch byproducts. The observation window may also lose some of its transparency when its interior surface is etched by the etching plasma within the plasma processing chamber. At some point, the increasing opacity of the observation window degrades the signal-to-noise ratio of the reflected beam to the point where useful information pertaining to the etch depth may no longer be obtained. In some cases, the loss of transparency occurs as quickly as during the etch of a single substrate. This results in a need to either clean the chamber or replace the observation window, either of which increases the costs associated with processing substrates.

In view of the foregoing, there are desired improved techniques for prolonging the time during which the observation window remains transparent and useful for interferometry-based monitoring purposes.

SUMMARY OF THE INVENTION

The invention relates, in one embodiment, to a window of a plasma processing chamber. The window includes a first dielectric portion having a first electrical thickness and a first resistivity to an etching plasma that is formed within the plasma processing chamber. There is further included a second dielectric portion disposed within the circumference of the first dielectric portion. The second dielectric portion has a second electrical thickness that is less than the first electrical thickness. The second dielectric portion is formed of a substantially transparent material and having a second resistivity to the etching plasma. The second resistivity is higher than the first resistivity.

In another embodiment, the invention relates to a plasma processing chamber configured for processing substrates. The plasma processing chamber includes a first electrode disposed outside the plasma processing chamber. There is included a substrate holder disposed within the plasma processing chamber. There is also included a dielectric window disposed between the first electrode and the substrate holder. There is further included an observation window disposed on a surface of the plasma processing chamber. The observation window is substantially transparent to at least one of an illuminating beam and a reflected beam of an illumination source. Additionally, there is included a second electrode disposed outside the plasma processing chamber and proximate the observation window. The second electrode, when powered, is configured to facilitate bombardment of an interior surface of the observation window to reduce byproduct deposition on the interior surface of the observation window.

In yet another embodiment, the invention relates to a plasma processing chamber configured for processing substrates. The plasma processing chamber includes a first electrode disposed outside the plasma processing chamber. There is included a substrate holder disposed within the plasma processing chamber. There is also included a dielectric window formed of a first material and disposed between the first electrode and the substrate holder. Additionally, there is included an observation window formed of a second material and disposed in a void formed in the dielectric window. The observation window is substantially transparent to at least one of an illuminating beam and a reflected beam of an interferometry illumination source. The second material has a higher dielectric constant than the first material.

These and other advantages of the present invention will become apparent upon reading the following detailed descriptions and studying the various drawings.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
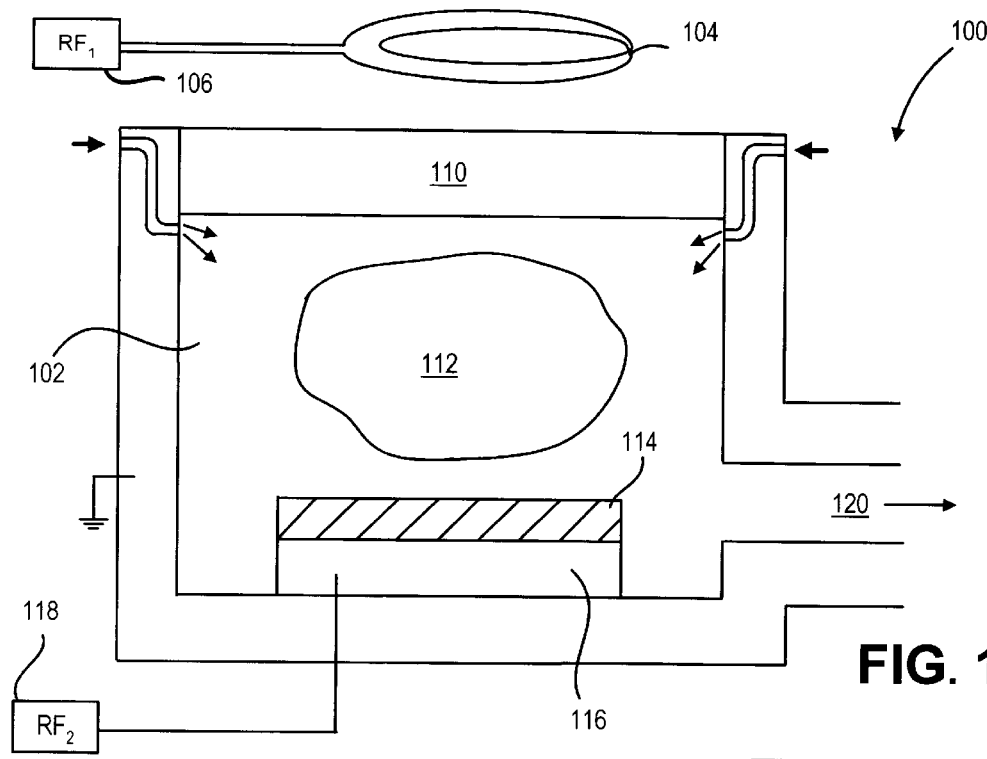
FIG. 1 illustrates a representative plasma processing chamber.
Figure 2:
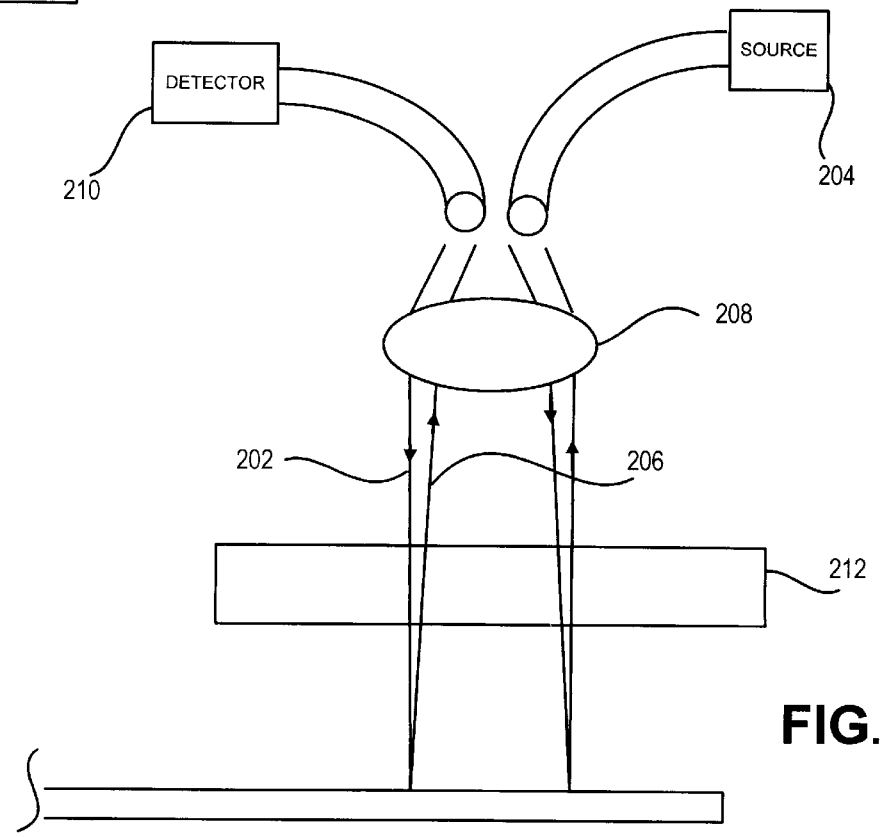
FIG. 2 illustrates a representative interferometry-based etch depth monitoring arrangement.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to avoid unnecessarily obscuring the present invention.

In accordance with one aspect of the invention, there is provided an improved observation window that is substantially transparent to the illuminating and reflected beams of the interferometry equipment and which is designed such that sputtering of the interior surface of the observation window is enhanced to remove the unwanted etch byproducts deposited thereon. When the deposited etch byproduct material is removed from the interior surface of the observation window at an enhanced rate, the transparency of the observation window may be maintained for a longer period of time. Thus, interferometry-based etch depth monitoring may be performed for a greater number of substrates before a chamber clean or window replacement is required.

Furthermore and in accordance with another aspect of the present invention, the observation window is preferably formed of a material that has a high resistance to being etched by the etching plasma. That is, the material forming the observation window is preferably formed of a material that has a high resistance to the chemical and physical etching effects of the etching plasma. Since etching is another mechanism contributing to the opacity of the observation window over time, the use of a material having a higher resistance to being etched advantageously permits the observation window to remain transparent longer.

In accordance with one preferred embodiment of the present invention, the observation window is formed right in the dielectric window of the plasma processing chamber (i.e., in the dielectric window that is disposed between the etching plasma and the powered electrode). The observation window is implemented by placing a plug of material that has a relatively high dielectric constant into a void formed within the existing dielectric window, which have a lower dielectric constant Thus, that portion has an effective electrical thickness (actual thickness divided by dielectric constant) that is "thinner" than other portions of the dielectric window. With the presence of a high voltage on the powered electrode of the plasma processing chamber, as is the case during plasma processing, the ac electric field magnitude increases under the observation window (relative to other portions of the dielectric window), the incident energy of bombarding plasma ions increases, and there will be more sputtering of any deposited material from the interior surface of the observation window (relative to other portions of the dielectric window). With enhanced sputtering, more of the etch byproduct material deposited on the observation window may be removed as mentioned earlier, thereby leaving the observation window cleaner and transparent for a longer period of time.

By way of example, if the dielectric window is formed of fused silica, as is typically the case, the observation window may be formed from, for example, a plug of sapphire. The higher dielectric constant of the sapphire material increases sputtering of the interior surface of the sapphire plug, allowing the sapphire plug to stay cleaner, and consequently transparent for a longer period of time. Sapphire also has the advantage of being more resistant to the etching plasma, particularly those formed from halogen-based etchant source gases such as chlorine-based or fluorine-based etchant source gases. Thus, the interior surface of the sapphire plug may resist etching better than the surrounding fused silica surface, allowing the interior surface of the sapphire plug to stay transparent longer.

By using only a small plug of the higher dielectric and more etch resistant material to form the observation window, the advantages associated with the higher dielectric and more etch resistant material are achieved without suffering the costs associated with using this material for the entire top dielectric window. By way of example, sapphire is a much more expensive material than fused silica, and there are cost as well as other advantages in not requiring the use of sapphire for the entire top dielectric window.

Furthermore, it is understood by the inventors herein that forming a sapphire window that is large enough to serve as the entire top dielectric window is extremely difficult, if possible at all, given the size of the top dielectric windows in current plasma processing chambers. By way of example, a typical top dielectric window in a plasma processing chamber employed for etching 300 mm wafers may be as large as 14–20 inches in diameter. It is the inventors' understanding that it would be impossible, given current technology, to form such a large window out of sapphire that is also thick and strong enough to withstand the pressure differential between the chamber interior and the ambient pressure. Even if a sapphire window of such a size can be formed using current technology, the cost of such a large sapphire window would be prohibitive. Additionally, one skilled in the art who did not recognize the potential use of the dielectric window as a site for implementing the interferometry-based etch depth monitoring technique would not naturally employ a much more expensive material for the dielectric window when a less expensive material would suffice for the purpose of inductively coupling the plasma to the powered electrode. Thus, the invention provides a way to employ the advantages associated with sapphire (e.g., higher etch resistance and decreased electrical thickness, which increases sputtering) without being constrained by the limits of contemporary sapphire manufacturing techniques or by the cost associated with the use of a large sapphire piece.

Figure 3A:
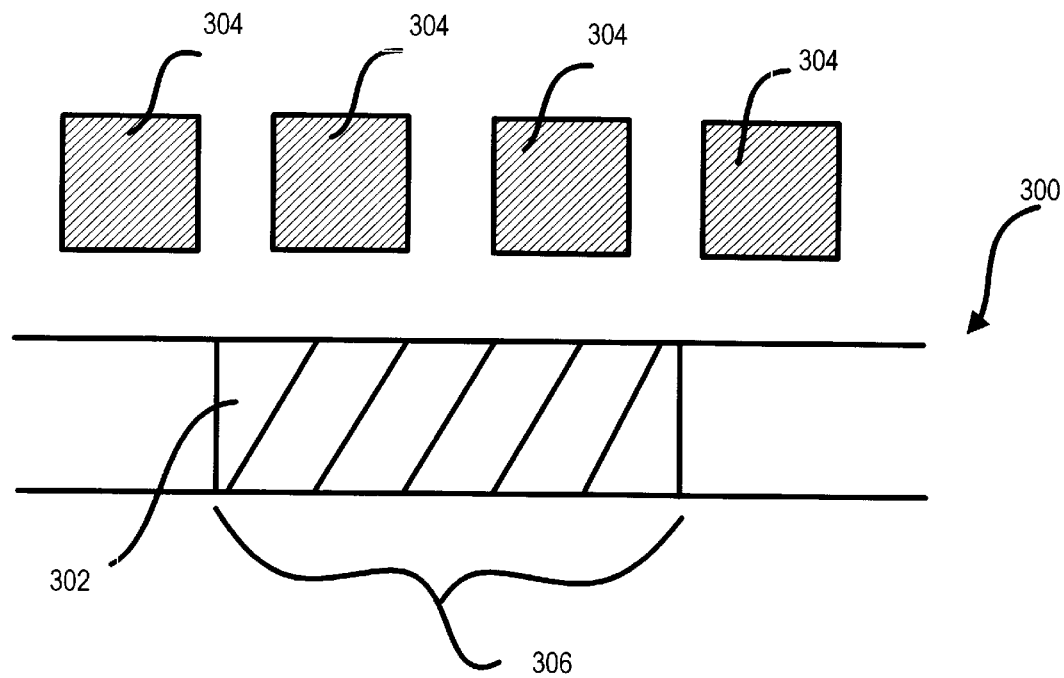
FIG. 3A illustrates, in accordance with one embodiment of the present invention, an improved observation window which is implemented in a void formed in the dielectric window of the plasma processing chamber.

To further discuss the features and advantages of the present invention, FIG. 3A depicts, in accordance with a preferred embodiment of the present invention, a cross-sectional view of dielectric window 300, including plug portion 302 that is formed from a substantially transparent material (relative to the illuminating and reflected beams of the interferometric monitoring equipment) but having a higher dielectric constant and higher etch resistance than the surrounding material of the remainder of the dielectric window. For ease of discussion, the cross section of a powered electrode 304, which is implemented as a coil in the example of FIG. 3A is also shown although the invention is not so limiting. Powered electrode 304 represents, in the example of FIG. 3A, the top electrode of an inductively coupled plasma processing chamber, while dielectric window 300 represents the dielectric window through which the plasma within the plasma processing chamber is inductively coupled with powered electrode 304. By way of example, dielectric window 300 may be made of fused silica, alumina, or a similarly suitable dielectric material and may be between 14–20 inches across and 1–2 inches thick. Of course the size and thickness of the dielectric window is typically governed by the design of the plasma processing chamber. Plug portion 302, which forms the observation window, may be formed of sapphire and may have a diameter of about 1 to 2 inches. However, plug portion 302 may be as small as permitted by the interferometric equipment or as large as desired (although a larger-than-necessary plug portion may unnecessarily increase the cost of the entire window due to the higher cost of the sapphire material).

Figure 3B:
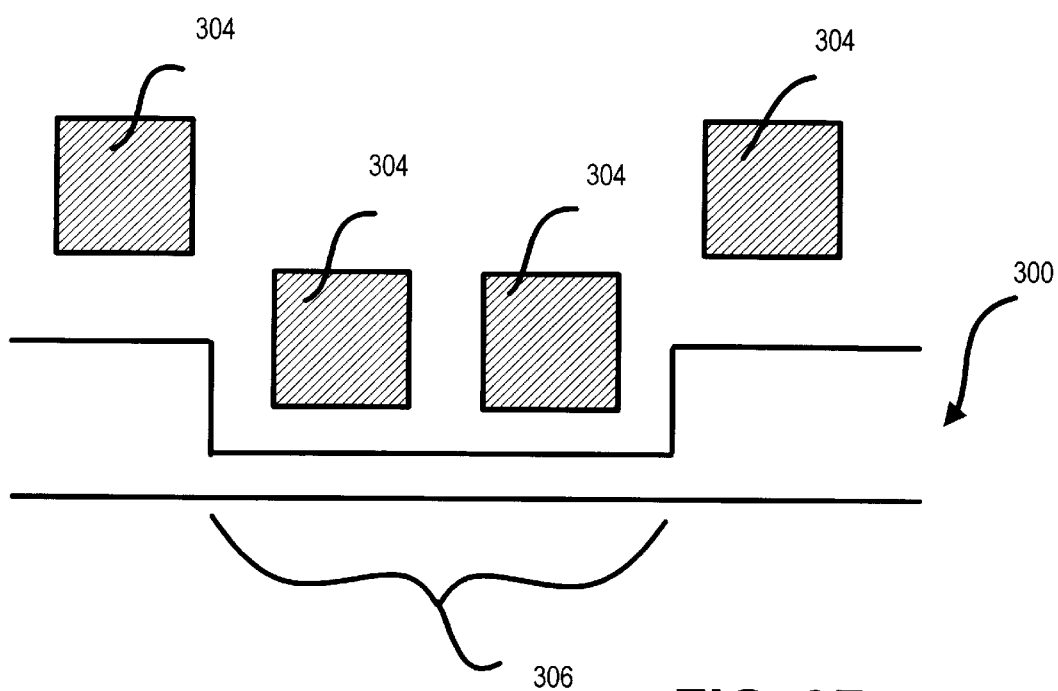
FIG. 3B conceptually illustrates the electrical thickness of the observation window of FIG. 3A relative to the electrical thickness of the surrounding dielectric window.

Due to the higher dielectric constant of plug portion 302, region 306 is electrically thinner than the electrical thickness associated with surrounding regions of the dielectric window. This is because the electrical thickness through a region varies inversely with the dielectric constant of the material forming that region. FIG. 3B depicts, in a conceptual manner, the electrical thickness at region 306 relative to the surrounding regions of the dielectric window. Because the high dielectric constant region is electrically thinner, the field lines are moved closer to the powered electrode in this region, and the plasma may be thought of as being electrically closer to the high voltage existing on the powered electrode, thereby increasing bombardment at region 306. This is depicted conceptually in FIG. 3B wherein the individual conductors of the powered electrode above region 306 are depicted to be "closer" to the plasma than other conductors. The increased bombardment keeps the interior surface at region 306 cleaner, and thus transparent for a longer period of time.

Figure 4:
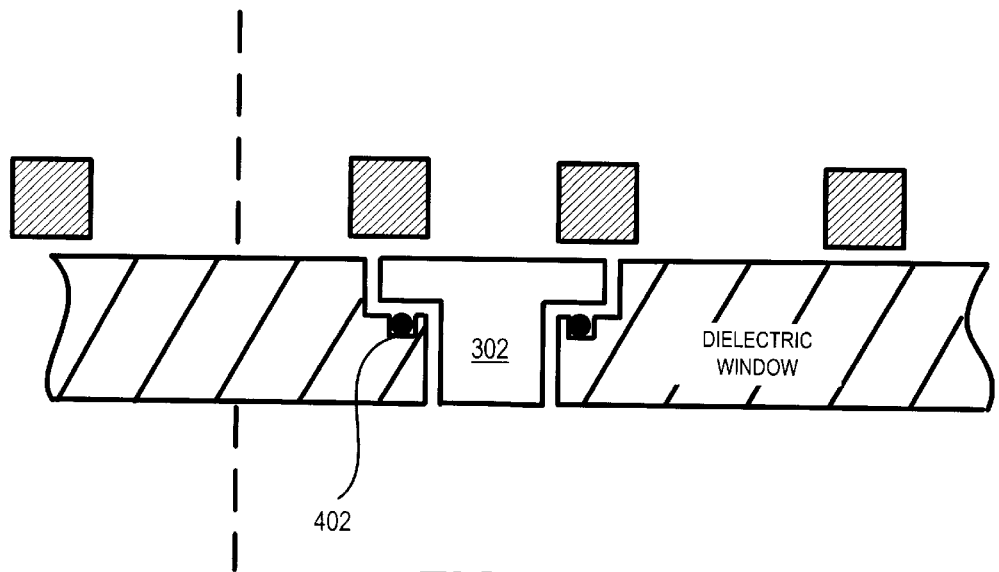
FIG. 4 illustrates, in accordance with another embodiment of the present invention, an improved observation window which is implemented in a void formed in the dielectric window.

Of course if plug portion 302 extends through the dielectric window, as in the case of FIG. 3A, plug portion 302 should be installed such that there is substantially no vacuum leak around the plug portion. This could be accomplished in a variety of ways, including using an appropriate seal arrangement. By way of example, FIG. 4 depicts one implementation wherein seal 402 is disposed between a flange of plug portion 302 and a shoulder formed in the remaining portion of the dielectric window. As another example, an appropriate adhesive may be employed to simply "glue" plug portion 302 into a through hole formed within the dielectric window or into a countersunk hole formed either at the top or bottom surface of the dielectric window.

Also, if the plug material also has a higher resistance than the dielectric window material to the etch effects of the etching plasma, then the plug is preferably exposed to the etching plasma to take advantage of the plugs ability to resist the loss of transparency due to etch effects. By way of example, if the plug is formed of sapphire and the etch employs a halogen-based etchant source gas, it is preferable that the lower surface of the sapphire plug be exposed directly to the plasma (i.e., no fused silica material between the lower surface of the plug and the plasma) so that the loss of transparency due to etching effects may be minimized.

Figure 5:
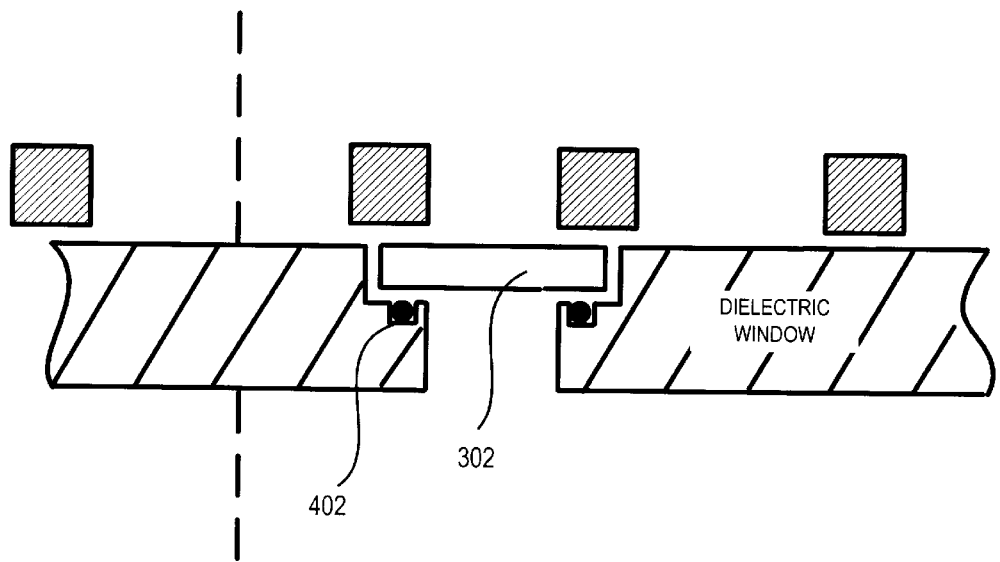
FIG. 5 illustrates, in accordance with still another embodiment of the present invention, an improved observation window which is also implemented in a void formed in the dielectric window.

It is not required that the lower surface of the plug (i.e., the surface exposed to the etching plasma) be flush with the lower surface of the dielectric window. FIG. 5 shows one implementation wherein a plug, or plate, of the higher dielectric constant and higher etch resistant material is recessed in a countersunk hole disposed in the top surface of the dielectric window. Thus sputtering is intensified at the bottom surface of the plug, which allows it to remain transparent for a longer period of time.

It is also contemplated that the electrically thinner window portion could be implemented by making a section of the dielectric window physically thinner, without requiring the use of a higher dielectric constant material. By way of example, a hole could be drilled from the top toward the bottom of the transparent dielectric window, without passing entirely through the window. A segment of the powered electrode could be located in the hole in such a way that it does not entirely obscure the view through the hole. This would increase the rate of sputter removal of material from the bottom of the dielectric window under the hole, where the powered electrode is both physically and electrically closer to the plasma. This implementation has the advantage of simplifying the vacuum sealing issue, since the lower surface of the dielectric window is unbroken, and the resulting window, relatively thick over most of its area and relatively thin over only a small fraction of its total area, can be much stronger than a window that is uniformly thin. However, this implementation does not address the effects of etching (both physical and chemical) on the transparency of the dielectric window, particularly at the portion of the window having the thinner electrical thickness. Thus, this implementation may be desirable only in situations wherein most of the loss of transparency comes from material deposition.

Note that in the examples of FIGS. 4 and 5, the powered electrode conductors are disposed such that there is some space between individual electrode conductors to allow the illuminating beams and/or the reflected beams to pass through the plug material. If the plug is sufficiently big so as to underlie more than two conductors of the powered electrode coil, the illuminated and reflected beams may traverse any suitable portion of the plug that remains sufficiently transparent between chamber cleans. It is preferable, however, that the location of the plug be chosen such that it is disposed between the plasma and one or more high voltage conductors. In some powered electrode designs, the center of the electrode itself (and therefore the center of the dielectric window) is a voltage null. In this case, the plug location may be offset from the center so that capacitively-induced sputtering may be achieved.

It should be noted that although a planar coil is shown for the powered electrode in the examples herein, the invention is not so limited. Any powered electrode that has thereon a voltage high enough to induce capacitive coupling with ions of the plasma to cause sputtering and to reduce etch byproduct material deposited thereon may be employed to keep the plug clean and transparent for a longer period of time.

Although the above discussion is made in the context of an observation window that is inserted into a dielectric window of the plasma processing chamber, it is contemplated that a separate observation window that is disposed elsewhere on the walls (or ceiling) of the plasma processing chamber may be provided. Increased sputtering on this separate observation window may be achieved by placing a conductor having thereon a high voltage outside of the plasma chamber and behind this observation window to capacitively induce sputtering. This is in contrast to the prior art situation wherein a sapphire window may be situated on the grounded chamber wall, and no capacitively-induced sputtering occurs at the window inner surface to reduce the amount of etch byproduct material deposited thereon. When so implemented, the observation window may remain clean and transparent for a longer period of time.

The dimension of the observation window so implemented is not dependent on the size of the substrate (as in the case of the dielectric window between the powered electrode and the plasma). Instead, such an observation window may be quite small, and may be formed out of a single piece of sapphire using current technology. Also, such a window, unlike the dielectric window through which plasma is inductively coupled to the powered electrode, may advantageously be placed at any convenient location on the chamber wall, such as along the sidewalls. The exact voltage required on the electrode disposed behind the observation window depends on how much sputtering is desired, and this value may vary depending on the geometry of the plasma processing chamber, the etchant employed, the location of the observation window relative to the plasma, and the like. In general, it is contemplated that a few hundred volts may suffice.

Due to the increased sputtering and higher etch resistance, which allow the observation window to stay transparent longer, the invention advantageously makes it possible to implement interferometry-based etch depth monitoring even for substrates processed in high density (e.g., greater than about $10^{12}$ ions/cm$^3$) plasma processing chambers. This is highly advantageous since interferometry-based etch depth monitoring has not been successfully implemented in high density plasma processing chambers, precisely because of the inability to keep the observation window transparent long enough in these systems. This is partly due to the fact that the plasma is denser and more reactive in the high density plasma processing chambers, which potentially can cause more byproduct deposition and etch damage on the observation window.

While this invention has been described in terms of several preferred embodiments, there are alterations, permutations, and equivalents which fall within the scope of this invention. By way of example, although the advantages of the improved high sputter window have been discussed in connection mainly with interferometry-based etch depth monitoring, keeping the dielectric window or a portion thereof relatively free of deposits also has advantageous implications for the etch process (e.g., in terms of particulate contamination). Accordingly, there are many advantages inherent in the use of the inventive technique of keeping processing chamber windows cleaner. Furthermore, although sapphire is mentioned as one possible observation window material, other high dielectric constant materials may also be employed. For example, a monocrystal quartz plug may be employed as the observation window material when disposed in a dielectric window formed of fused silica. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A window of a plasma processing chamber, comprising:
    a first dielectric portion having a first electrical thickness and a first resistivity to an etching plasma that is formed within said plasma processing chamber;
    a second dielectric portion disposed within said first dielectric portion and forming a window portion, said window portion having a second electrical thickness that is less than said first electrical thickness, said second dielectric portion being formed of a substantially transparent material and having a second resistivity to said etching plasma, said second resistivity being higher than said first resistivity.

2. The window of claim 1 wherein said second dielectric portion is formed of a material that has a higher dielectric constant than a material of said first dielectric portion.

3. The window of claim 1 wherein said second dielectric portion has at least one surface exposed to said etching plasma.

4. The window of claim 1 wherein said etching plasma represents a high density plasma.

5. The window of claim 1 wherein said first dielectric portion is formed of fused silica and said second dielectric portion is formed of sapphire.

6. The window of claim 5 wherein said second dielectric portion is also physically thinner than said first dielectric portion.

7. The window of claim 1 wherein said window is also employed as a dielectric window through which said etching plasma is inductively coupled to an electrode.

8. A window of a plasma processing chamber, comprising:
    a first dielectric portion having a first electrical thickness and a first resistivity to an etching plasma that is formed within said plasma processing chamber;
    a second dielectric portion disposed within said first dielectric portion, said second dielectric portion having a second electrical thickness that is less than said first electrical thickness, said second dielectric portion being formed of a substantially transparent material and having a second resistivity to said etching plasma said second resistivity being higher than said first resistivity;
    wherein said window is also employed as a dielectric window through which said etching plasma is inductively coupled to an electrode and said second dielectric portion is offset from a center of said window.

9. A plasma processing chamber configured for processing substrates, comprising:
    a first electrode disposed outside said plasma processing chamber;
    a substrate holder disposed within said plasma processing chamber;
    a dielectric window disposed between said first electrode and said substrate holder;
    an observation window disposed on a surface of said plasma processing chamber, said observation window being substantially transparent to at least one of an illuminating beam and a reflected beam of an illumination source;
    a second electrode disposed outside said plasma processing chamber and proximate said observation window, said second electrode, when powered, is configured to facilitate bombardment of an interior surface of said observation window to reduce byproduct deposition on said interior surface of said observation window.

10. The plasma processing chamber of claim 9 wherein said observation window is formed of a material that is more resistant to an etching plasma in said plasma processing chamber than a material of said dielectric window.

11. The plasma processing chamber of claim 10 wherein said observation window is formed of sapphire.

12. The plasma processing chamber of claim 9 wherein said first electrode is configured to inductively couple to a plasma formed within said plasma processing chamber.

13. The plasma processing chamber of claim 9 wherein said first electrode is configured to form a high density plasma within said plasma processing chamber.

14. A plasma processing chamber configured for processing substrates, comprising:
    a first electrode disposed outside said plasma processing chamber;
    a substrate holder disposed within said plasma processing chamber;
    a dielectric window formed of a first material and disposed between said first electrode and said substrate holder;
    an observation window formed of a second material and disposed in a void formed in said dielectric window, said observation window being substantially transparent to at least one of an illuminating beam and a reflected beam of an interferometry illumination source, said second material having a higher dielectric constant than said first material.

15. The plasma processing chamber of claim 14 wherein said second material is more resistant to an etching plasma in said plasma processing chamber than said first material.

16. The plasma processing chamber of claim 15 wherein said second material is sapphire.

17. The plasma processing chamber of claim 14 wherein said first electrode is configured to inductively couple to a plasma formed within said plasma processing chamber.

18. The plasma processing chamber of claim 14 wherein said first electrode is configured to form a high density plasma within said plasma processing chamber.

* * * * *